United States Patent
Zeng et al.

(10) Patent No.: US 10,629,269 B2
(45) Date of Patent: Apr. 21, 2020

(54) SOLID STATE STORAGE DEVICE AND READ TABLE MANAGEMENT METHOD THEREOF

(71) Applicants: Lite-On Electronics (Guangzhou) Limited, Guangzhou (CN); LITE-ON TECHNOLOGY CORPORATION, Taipei (TW)

(72) Inventors: Shih-Jia Zeng, Taipei (TW); Chun-Wei Kuo, Taipei (TW); Kuan-Chun Chen, Taipei (TW); Jen-Chien Fu, Taipei (TW)

(73) Assignee: SOLID STATE STORAGE TECHNOLOGY CORPORATION, Taipei (TW)

( * ) Notice: Subject to any disclaimer, the term of this patent is extended or adjusted under 35 U.S.C. 154(b) by 13 days.

(21) Appl. No.: 16/135,159

(22) Filed: Sep. 19, 2018

(65) Prior Publication Data
US 2020/0035307 A1    Jan. 30, 2020

(30) Foreign Application Priority Data
Jul. 25, 2018 (CN) .......................... 2018 1 0828225

(51) Int. Cl.
*G11C 16/26* (2006.01)
*G06F 12/02* (2006.01)
*G11C 16/04* (2006.01)

(52) U.S. Cl.
CPC .......... *G11C 16/26* (2013.01); *G06F 12/0284* (2013.01); *G11C 16/0441* (2013.01); *G11C 2216/12* (2013.01)

(58) Field of Classification Search
CPC . G11C 16/26; G11C 16/0441; G11C 2216/12; G06F 12/0284
See application file for complete search history.

(56) References Cited

U.S. PATENT DOCUMENTS

| | | | |
|---|---|---|---|
| 9,209,835 B2* | 12/2015 | Alhussien | .......... H03M 13/1125 |
| 9,286,994 B1* | 3/2016 | Chen | ...................... G11C 16/08 |
| 2016/0027524 A1* | 1/2016 | Park | ................... G11C 16/3445 365/185.18 |

* cited by examiner

*Primary Examiner* — Yaima Rigol
*Assistant Examiner* — Kendrick Lam
(74) *Attorney, Agent, or Firm* — WPAT, PC

(57) ABSTRACT

A read table management method for a solid state storage device includes the following steps. If the lowest computation value in a hot group is lower than the highest computation value in a cold group when a read table adjusting process is enabled, a first read voltage set corresponding to the lowest computation value in the hot group and a second read voltage set corresponding to the highest computation value in the cold group are swapped with each other. Consequently, the second read voltage set becomes to belong to the hot group, and the first read voltage set becomes to belong to the cold group.

12 Claims, 6 Drawing Sheets

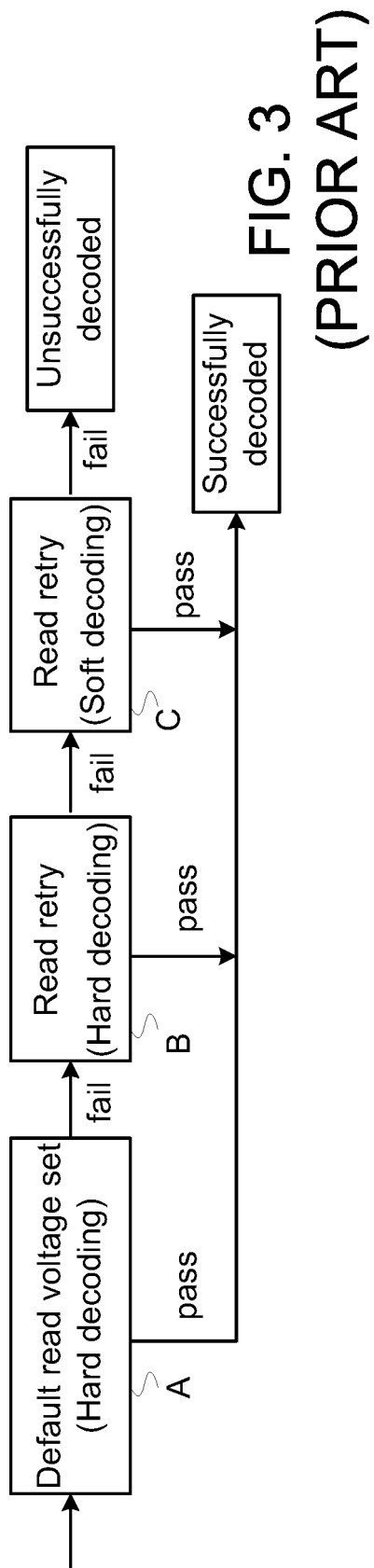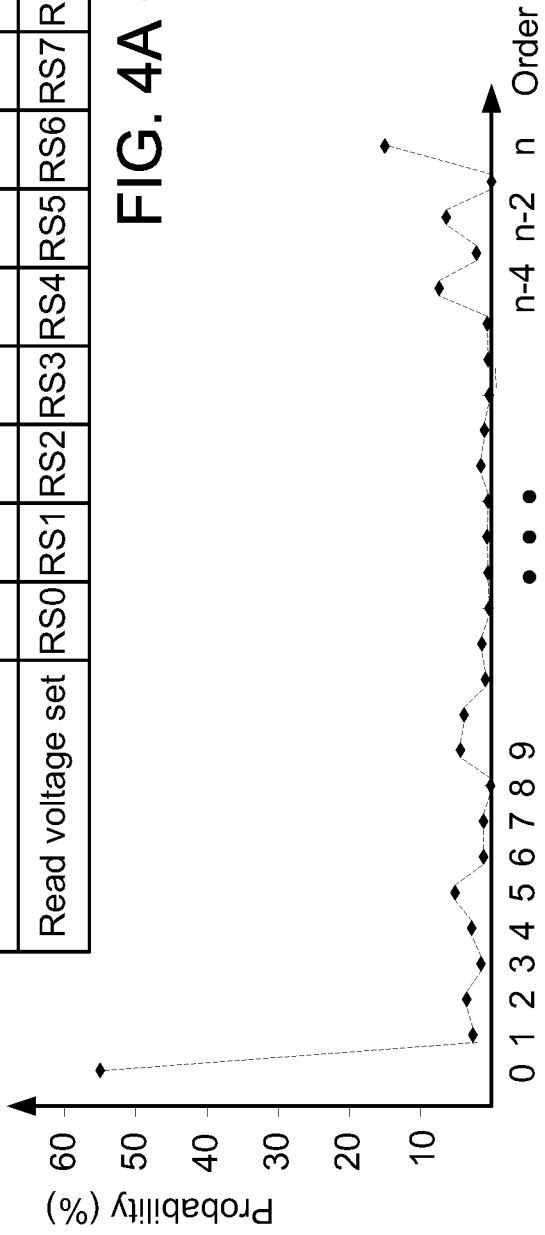

| Order | 0 | 1 | 2 | 3 | 4 | 5 | 6 | 7 | 8 | 9 | 10 |
|---|---|---|---|---|---|---|---|---|---|---|---|
| Group | | Hot group | | | | Cold group | | | | | |
| Read voltage set | RS0 | RS1 | RS2 | RS3 | RS4 | RS5 | RS6 | RS7 | RS8 | RS9 | RS10 |
| Accumulative count | 0 | 0 | 0 | 0 | 0 | 0 | 0 | 0 | 0 | 0 | 0 |

| Order | 0 | 1 | 2 | 3 | 4 | 5 | 6 | 7 | 8 | 9 | 10 |
|---|---|---|---|---|---|---|---|---|---|---|---|
| Group | | Hot group | | | | | Cold group | | | | |
| Read voltage set | RS0 | RS1 | RS2 | RS3 | RS4 | RS5 | RS6 | RS7 | RS8 | RS9 | RS10 |
| Accumulative count | 853 | 26 | 15 | 32 | 3 | 0 | 1 | 60 | 0 | 5 | 5 |

FIG. 7B

| Order | 0 | 1 | 2 | 3 | 4 | 5 | 6 | 7 | 8 | 9 | 10 |
|---|---|---|---|---|---|---|---|---|---|---|---|
| Group | | Hot group | | | | | Cold group | | | | |
| Read voltage set | RS0 | RS1 | RS7 | RS3 | RS4 | RS5 | RS6 | RS2 | RS8 | RS9 | RS10 |
| Accumulative count | 853 | 26 | 60 | 32 | 3 | 0 | 1 | 15 | 0 | 5 | 5 |

FIG. 7C

| Order | 0 | 1 | 2 | 3 | 4 | 5 | 6 | 7 | 8 | 9 | 10 |
|---|---|---|---|---|---|---|---|---|---|---|---|
| Group | | Hot group | | | | | Cold group | | | | |
| Read voltage set | RS0 | RS1 | RS7 | RS3 | RS4 | RS5 | RS6 | RS2 | RS8 | RS9 | RS10 |
| Accumulative count | 1553 | 51 | 140 | 72 | 10 | 2 | 10 | 29 | 3 | 85 | 45 |

FIG. 7D

| Order | 0 | 1 | 2 | 3 | 4 | 5 | 6 | 7 | 8 | 9 | 10 |
|---|---|---|---|---|---|---|---|---|---|---|---|
| Group | Hot group | | | Cold group | | | | | | | |
| Read voltage set | RS0 | RS9 | RS7 | RS3 | RS4 | RS5 | RS6 | RS2 | RS8 | RS1 | RS10 |
| Accumulative count | 1553 | 85 | 140 | 72 | 10 | 2 | 10 | 29 | 3 | 51 | 45 |

FIG. 7E

| Order | 0 | 1 | 2 | 3 | 4 | 5 | 6 | 7 | 8 | 9 | 10 |
|---|---|---|---|---|---|---|---|---|---|---|---|
| Group | Hot group | | | Cold group | | | | | | | |
| Read voltage set | RS0 | RS9 | RS7 | RS3 | RS4 | RS5 | RS6 | RS2 | RS8 | RS1 | RS10 |
| Accumulative count | 2205 | 185 | 238 | 107 | 12 | 5 | 11 | 34 | 14 | 55 | 134 |

FIG. 7F

| Order | 0 | 1 | 2 | 3 | 4 | 5 | 6 | 7 | 8 | 9 | 10 |
|---|---|---|---|---|---|---|---|---|---|---|---|
| Group | Hot group | | | Cold group | | | | | | | |
| Read voltage set | RS0 | RS9 | RS7 | RS10 | RS4 | RS5 | RS6 | RS2 | RS8 | RS1 | RS3 |
| Accumulative count | 2205 | 185 | 238 | 134 | 12 | 5 | 11 | 34 | 14 | 55 | 107 |

SOLID STATE STORAGE DEVICE AND READ TABLE MANAGEMENT METHOD THEREOF

This application claims the benefit of People's Republic of China Patent Application No. 201810828225.4, filed Jul. 25, 2018, the subject matter of which is incorporated herein by reference.

FIELD OF THE INVENTION

The present invention relates to a solid state storage device and a control method, and more particularly to a solid state storage device and a read table management method thereof.

BACKGROUND OF THE INVENTION

As is well known, solid state storage devices such as SD cards or solid state drives (SSD) are widely used in various electronic devices.

Generally, a solid state storage device comprises a non-volatile memory. After data are written to the non-volatile memory, if no electric power is supplied to the solid state storage device, the data are still retained in the non-volatile memory.

FIG. 1 is a schematic functional block diagram illustrating the architecture of a conventional solid state storage device. As shown in FIG. 1, the solid state storage device 10 comprises a control circuit 101 and a non-volatile memory 107.

The control circuit 101 further comprises an error correction (ECC) circuit 104 and a read table 105. The read table 105 is stored in a memory of the control circuit 101. In addition, the read table 105 stores plural read voltage sets.

The non-volatile memory 107 further comprises a memory cell array 109. The memory cell array 109 comprises plural memory cells. Generally, the memory cell array 109 is divided into plural blocks, and each block is divided into plural pages.

The solid state storage device 10 is connected with a host 14 through an external bus 12. For example, the external bus 12 is a USB bus, an SATA bus, a PCIe bus, an M.2 bus, a U.2 bus, or the like.

Moreover, the control circuit 101 is connected with the non-volatile memory 107 through an internal bus 113. According to a write command from the host 14, the control circuit 101 stores the write data from the host 14 to the memory cell array 109. Alternatively, according to a read command from the host 14, the control circuit 101 acquires a read data from the memory cell array 109. In addition, the read data is transmitted to the host 14 through the control circuit 101.

Generally, the read table 105 of the control circuit 101 stores a default read voltage set. When the control circuit 101 receives a read command, the control circuit 101 actives a read cycle. During the read cycle, the control circuit 101 transmits an operation command to the non-volatile memory 107 through the internal bus 113. The control circuit 101 uses the default read voltage set to initially read the data stored in the memory cell array 109 of the non-volatile memory 107.

The ECC circuit 104 of the control circuit 101 is used for correcting the error bits of the read data. After the error bits of the read data are corrected, the corrected read data are transmitted to the host 14.

However, if the ECC circuit 104 is unable to successfully correct all bits of the read data, the read table 105 of the control circuit 101 provides other retry read voltage sets. According to the retry read voltage sets, the control circuit 101 performs a read retry operation on the non-volatile memory 107.

Depending on the data amount to be stored in the memory cell, the memory cells may be classified into four types, i.e. a single-level cell (SLC), a multi-level cell (MLC), a triple-level cell (TLC) and a quad-level cell (QLC). The SLC can store only one bit of data per cell. The MLC can store two bits of data per cell. The TLC can store three bits of data per cell. The QLC can store four bits of data per cell. In other words, the memory cell array 109 is a SLC memory cell array, a MLC memory cell array, a TLC memory cell array or a QLC memory cell array.

In the memory cell array 109, each memory cell comprises a floating gate transistor. By adjusting the number of hot carriers injected into a floating gate of the floating gate transistor, the storing state of the floating gate transistor is adjusted. In other words, the floating gate transistor of each SLC has two storing states, the floating gate transistor of each MLC has four storing states, the floating gate transistor of each TLC has eight storing states, and the floating gate transistor of each QLC has sixteen storing states.

FIG. 2A schematically illustrates the threshold voltage distribution curves of triple-level cells in different storing states. According to the number of injected hot carriers, the triple-level cell has eight storing states "Erase" and "A"~"G". Before the hot carriers are injected into the memory cell, the memory cell is in a storing state "Erase". As the number of the injected hot carriers increases, the memory cell is sequentially in the other seven storing states "A"~"G". For example, the memory cell in the storing state "G" has the highest threshold voltage, and the memory cell in the storing state "Erase" has the lowest threshold voltage. After an erase cycle, the memory cell is restored to the storing state "Erase", and no hot carriers are retained in the memory cell.

In practice, even if many memory cells are programed to the same storing state, the threshold voltages of these memory cells are not all identical. That is, the threshold voltages of these memory cells are distributed in a specified distribution curve with a median threshold voltage. The median threshold voltage of the memory cells in the storing state "Erase" is Ver. The median threshold voltage of the memory cells in the storing state "A" is Va. The median threshold voltage of the memory cells in the storing state "B" is Vb. The median threshold voltage of the memory cells in the storing state "C" is Vc. The median threshold voltage of the memory cells in the storing state "D" is Vd. The median threshold voltage of the memory cells in the storing state "E" is Ve. The median threshold voltage of the memory cells in the storing state "F" is Vf. The median threshold voltage of the memory cells in the storing state "G" is Vg. For example, the threshold voltage of the most number of memory cells in the storing state "A" is the median threshold voltage Va.

Please refer to FIG. 2A again. According to the above characteristics of the triple-level cell, a default read voltage set including seven read voltages Vra~Vrg is defined. During the read cycle, the control circuit 101 provides the default read voltage set to the non-volatile memory 107 in order to detect the storing states of the triple-level cells of the memory cell array 109.

The storing states of the triple-level cells are determined according to the read voltages Vra~Vrg. For example, the read voltage Vrg is provided to the memory cell array 109. If the threshold voltage of the memory cell is higher than the read voltage Vrg and the memory cell is turned off, the memory cell is judged to be in the storing state "G". Whereas, if the threshold voltage of the memory cell is lower than the read voltage Vrg and the memory cell is turned on, the memory cell is not in the storing state "G". In other words, the eight storing states of the triple-level cells are determined according to the seven read voltages Vra~Vrg of the default read voltage set.

Similarly, the sixteen storing states of the quad-level cells are determined according to fifteen read voltages of the default read voltage set. Similarly, four storing states of the multi-level cells are determined according to three read voltages of the default read voltage set. Similarly, two storing states of the single-level cells are determined according to one read voltage of the default read voltage set.

FIG. 2B schematically illustrates the shift of the threshold voltage distribution curves of triple-level cells in different storing states. In some situations such as a cycling condition, a high/room temperature baking condition or a read disturbing condition, the threshold voltage distribution curves of the memory cells of the memory cell array 109 are possibly shifted. Moreover, if the data retention time of the triple-level cells is very long (e.g., over one month), the threshold voltage distribution curves are possibly shifted.

As shown in FIG. 2B, the threshold voltage distribution curves of the triple-level cells are shifted. The median threshold voltage of the memory cells in the storing state "Erase" is Ver'. The median threshold voltage of the memory cells in the storing state "A" is Va'. The median threshold voltage of the memory cells in the storing state "B" is Vb'. The median threshold voltage of the memory cells in the storing state "C" is Vc'. The median threshold voltage of the memory cells in the storing state "D" is Vd'. The median threshold voltage of the memory cells in the storing state "E" is Ve'. The median threshold voltage of the memory cells in the storing state "F" is Vf'. The median threshold voltage of the memory cells in the storing state "G" is Vg'.

If the storing states of the triple-level cells are determined according to the read voltages Vra~Vrg of the default read voltage set, the number of error bits in the read data increases. If the ECC unit 104 is unable to successfully correct all bits of the read data, the read table 105 of the control circuit 101 provides another retry read voltage set including the read voltages Vra'~Vrg'. According to the retry read voltage set, the control circuit 101 performs the read retry process.

FIG. 3 is a flowchart illustrating an error correction method for the conventional solid state storage device. During the read cycle, the control circuit 101 performs a decoding process A. In the decoding process A, a hard decoding operation is performed according to the default read voltage set. That is, the control circuit 101 provides the default read voltage set to the non-volatile memory 107, and the ECC circuit 104 performs the hard decoding operation to correct the read data.

If the error bits in the read data can be corrected, it means that the decoding process A passes and the decoding operation is successfully done. Consequently, the read data is accurately transmitted from the control circuit 101 to the host 14. Whereas, if the error bits in the read data cannot be corrected, the read data is not accurately acquired and the decoding process A fails. Then, the control circuit 101 performs a read retry process.

After the control circuit 101 enters the read retry process, a decoding process B is firstly performed. In the decoding process B, a hard decoding operation is performed according to a retry read voltage set. For example, the read table 105 of the control circuit 101 provides the selected retry read voltage set Vra'~Vrg' to the non-volatile memory 107 to acquire the read data. Then, the ECC circuit 104 performs the hard decoding operation to correct the read data. If the error bits in the read data can be corrected, it means that the decoding operation is successfully done to pass the decoding process B. Consequently, the read data is accurately transmitted from the control circuit 101 to the host 14. Whereas, if the error bits in the read data cannot be corrected, the read data is not accurately acquired and the decoding process B fails. Then, the read table 105 of the control circuit 101 continuously provides another selected retry read voltage set to the non-volatile memory 107 to acquire the read data.

Generally, plural retry read voltage sets (e.g., n retry read voltage sets) have been stored in the read table 105 of the control circuit 101. If the decoding operation is successfully done according to one of the plural retry read voltage sets, it means that the decoding process B passes. Whereas, if the data cannot be successfully decoded according to the entire of the n retry read voltage sets, it means that the decoding process B fails. Then, the control circuit 101 performs a decoding process C. Obviously, the time period of performing the decoding process B is longer than the time period of performing the decoding process A.

In the decoding process C, a soft decoding operation is performed according to the retry read voltage set. Generally, the soft decoding operation has better error correction capability than the hard decoding operation. However, while the soft decoding operation is performed, the control circuit 101 acquires one read data according to many retry read voltage sets. In other words, the time period of performing the soft decoding operation is longer. That is, the time period of performing the decoding process C is longer than the time period of performing the decoding process B.

Similarly, if the decoding operation is successfully done by the control circuit 101, it means that the decoding process C passes. Consequently, the read data is accurately transmitted from the control circuit 101 to the host 14. Whereas, if the data cannot be successfully decoded by the control circuit 101, it means that the decoding process C fails. Under this circumstance, the control circuit 101 confirms that the read data cannot be accurately acquired and generates a failed message to the host 14 to indicate that the decoding process fails.

As mentioned above, if the decoding process A fails, the control circuit 101 enters the read retry process. In the read retry process, the control circuit 101 has to perform the decoding process B at first. If the control circuit 101 confirms that the decoding process B fails, the control circuit 101 performs the decoding process C. If the control circuit 101 confirms that the decoding process C fails, the control circuit 101 issues the failed message to the host 14 and is unable to provide the accurate read data.

Generally, after the non-volatile memory 107 is produced, the non-volatile memory 107 will undergo many experiments. Consequently, plural read voltage sets are acquired and provided to the manufacturer of the solid state storage device 10. When the solid state storage device 10 leaves the factory, these read voltage sets have been stored in the read table 105 of the control circuit 101. In the normal working state, the solid state storage device 10 performs the decoding process A, the decoding process B and the decoding process C of FIG. 3 according to the read voltage sets in the read table 105.

FIG. 4A schematically illustrates a conventional read table. The read table 105 contains an order field and (n+1) read voltage sets RS0~RSn. The control circuit 101 provides the (n+1) read voltage sets to the non-volatile memory 107 according to the orders listed in the order field of the read table 105.

For example, the read voltage set RS0 corresponding to the order "0" is firstly provided to the non-volatile memory 107. In addition, the read voltage set RS0 is set as a default read voltage set. During the read retry process, the read voltage sets RS1~RSn corresponding to the order "1"~order "n" are sequentially provided to the non-volatile memory 107. The read voltage sets RS1~RSn are set as n retry read voltage sets.

While the decoding process A of FIG. 3 is performed, the read table 105 of the control circuit 101 provides the default read voltage set RS0 to the non-volatile memory 107. Similarly, while the decoding process B of FIG. 3 is performed, the read table 105 of the control circuit 101 provides the n read voltage sets RS1~RSn to the non-volatile memory 107 sequentially.

Conventionally, after the (n+1) read voltage sets RS0~RSn are recorded in the read table 105 of the control circuit 101, the sequence of these read voltage sets is unchanged. Under this circumstance, the read speed of the solid state storage device 10 possibly become slower.

For example, after many read cycles of the solid state storage device 10, the relationships between the read voltage sets and the successful read probabilities are acquired according to the statistic result. FIG. 4B is a plot illustrating the relationship between the read voltage sets and the successful read probabilities.

As shown in FIG. 4B, the successful read probability is the highest (e.g., about 55%) according to the read voltage set RS0 corresponding to the order "0". Consequently, during the read cycle, the probability of acquiring the accurate read data by performing the decoding process A according to the read voltage set RS0 is high.

While the decoding process B of the read retry process is performed, the control circuit 101 provides the n read voltage sets RS1~RSn to the non-volatile memory 107 sequentially. As shown in FIG. 4B, the probability (e.g., about 15%) of acquiring the accurate read data by performing the decoding process B according to the last (or n-th) retry read voltage set RSn is higher than other retry read voltage sets RS1~RSn-1.

In other words, while the control circuit 101 performs the decoding process B of the read retry process, the data cannot be successfully decoded according to the (n-1) retry read voltage sets RS1~RSn-1. Until the last (or n-th) retry read voltage set RSn is provided to the non-volatile memory 107, the decoding process B passes. In other words, the read speed of the solid state storage device 10 obviously becomes slower.

SUMMARY OF THE INVENTION

An embodiment of the present invention provides a solid state storage device. The solid state storage device includes a control circuit and a non-volatile memory. The control circuit includes a read table. Moreover, plural read voltage sets and corresponding computation values are stored in the read table. First portions of the plural read voltage sets belong to a hot group. Second portions of the plural read voltage sets belong to a cold group. During a read cycle, the control circuit determines a selected read voltage set from the plural read voltage sets according to a specified sequence in the read table, and provides the selected read voltage set to the non-volatile memory. If a decoding operation is successful, the computation value corresponding to the selected read voltage set is modified. If the decoding operation is not successful, the control circuit determines a next selected read voltage set from the plural read voltage sets according to the specified sequence, and provides the next selected read voltage set to the non-volatile memory. If the lowest computation value in the hot group is lower than the highest computation value in the cold group when a read table adjusting process is enabled, a first read voltage set corresponding to the lowest computation value in the hot group and a second read voltage set corresponding to the highest computation value in the cold group are swapped with each other by the control circuit. Consequently, the second read voltage set becomes to belong to the hot group, and the first read voltage set becomes to belong to the cold group.

Another embodiment of the present invention provides a read table management method for a solid state storage device. The solid state storage device includes a control circuit and a non-volatile memory. The control circuit includes a read table. Moreover, plural read voltage sets and corresponding computation values are stored in the read table. First portions of the plural read voltage sets belong to a hot group. Second portions of the plural read voltage sets belong to a cold group. The read table management method includes the following steps. During a read cycle, a selected read voltage set from the plural read voltage sets is determined according to a specified sequence in the read table, and the selected read voltage set is provided to the non-volatile memory. If a decoding operation is successful, the computation value corresponding to the selected read voltage set is modified. If the decoding operation is not successful, a next selected read voltage set from the plural read voltage sets is determined according to the specified sequence, and the next selected read voltage set is provided to the non-volatile memory. If the lowest computation value in the hot group is lower than the highest computation value in the cold group when a read table adjusting process is enabled, allowing a first read voltage set corresponding to the lowest computation value in the hot group and a second read voltage set corresponding to the highest computation value in the cold group to be swapped with each other. Consequently, the second read voltage set becomes to belong to the hot group, and the first read voltage set becomes to belong to the cold group.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 3 (prior art) is a flowchart illustrating an error correction method for the conventional solid state storage device;

FIG. 4A (prior art) schematically illustrates a conventional read table;

FIG. 4B (prior art) is a plot illustrating the relationship between the read voltage sets and the successful read probabilities;

FIGS. 7A to 7F schematically illustrate the operations of the read table management method according to the embodiment of the present invention.

DETAILED DESCRIPTION OF PREFERRED EMBODIMENTS

As mentioned above, the sequence of providing the read voltage sets from the read table may influence the read speed of the solid state storage device. The present invention provides a solid state storage device and a read table management method. According to the use condition of the read voltage sets, the sequence of providing the read voltage sets from the read table is dynamically adjusted. Consequently, the read speed of the solid state storage device is increased.

Figure 1:
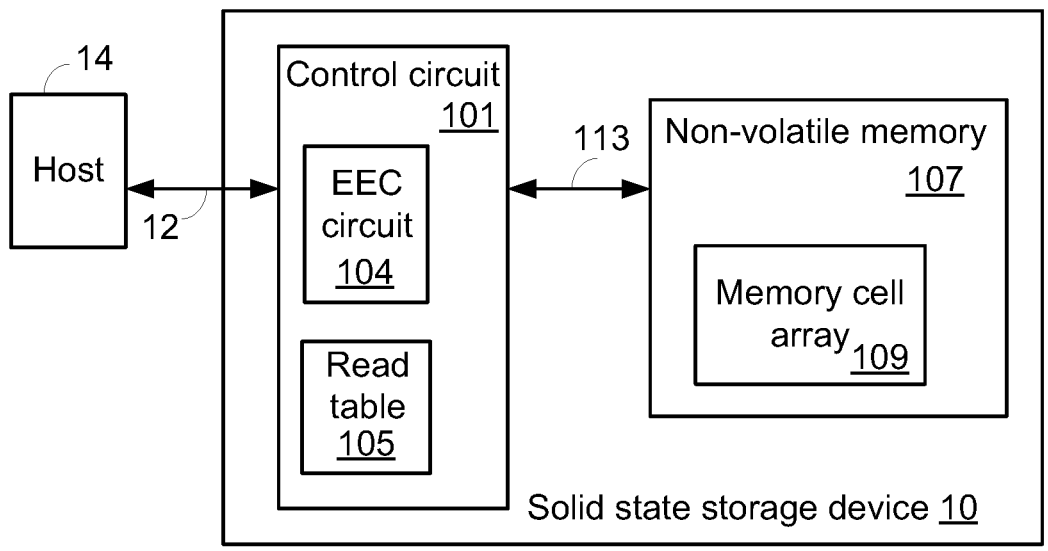
FIG. 1 (prior art) is a schematic functional block diagram illustrating the architecture of a conventional solid state storage device.
Figure 2A:
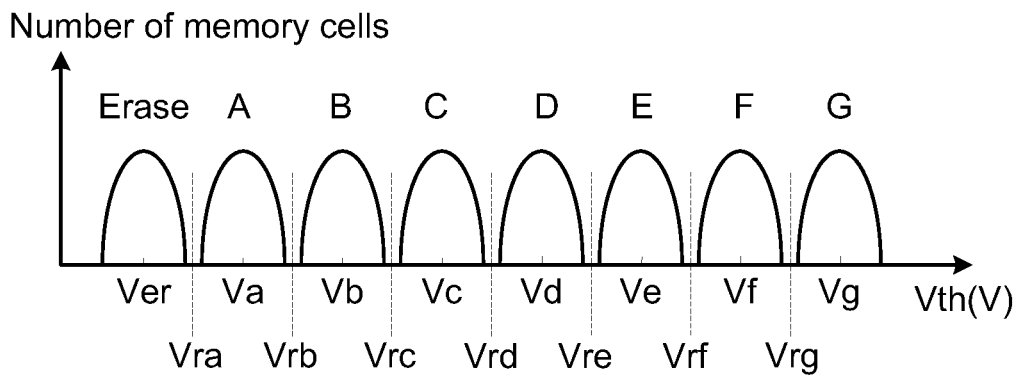
FIG. 2A (prior art) schematically illustrates the threshold voltage distribution curves of triple-level cells in different storing states.
Figure 2B:
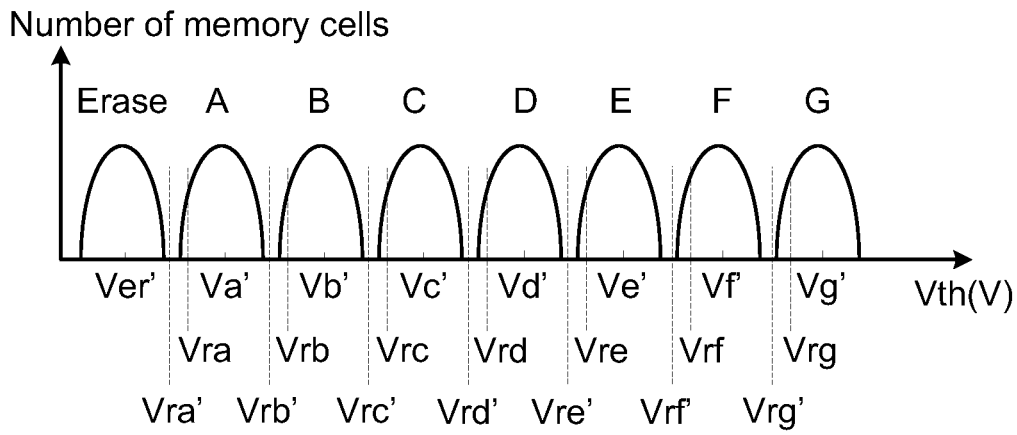
FIG. 2B (prior art) schematically illustrates the shift of the threshold voltage distribution curves of triple-level cells in different storing states.
Figures 5, 6A:
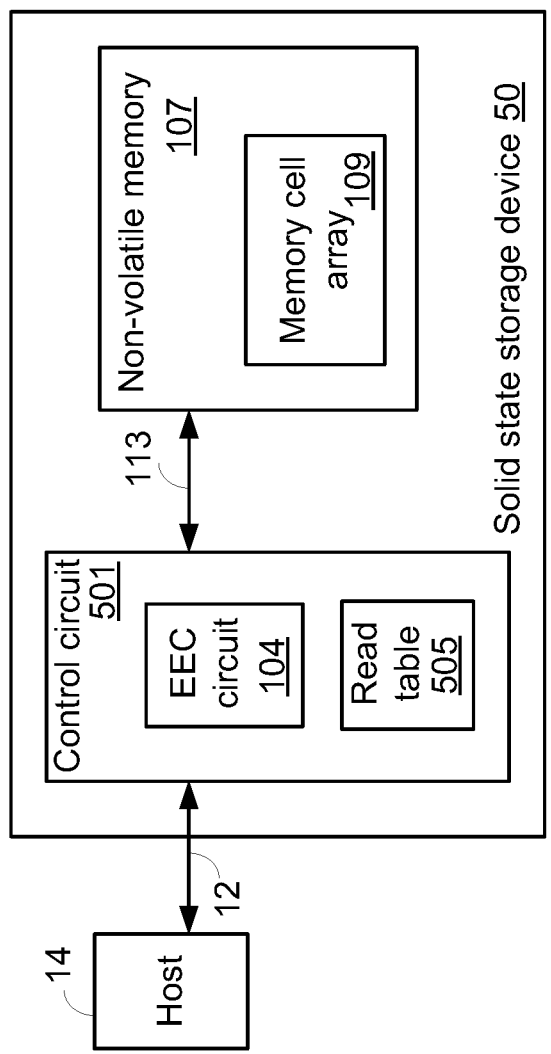
FIG. 5 is a schematic functional block diagram illustrating the architecture of a solid state storage device according to an embodiment of the present invention.
FIG. 6A schematically illustrates a read table of the solid state storage device according to the embodiment of the present invention.

FIG. 5 is a schematic functional block diagram illustrating the architecture of a solid state storage device according to an embodiment of the present invention. As shown in FIG. 5, the solid state storage device 50 comprises a control circuit 501 and a non-volatile memory 107. When compared with the conventional solid state storage device 10, the control circuit 501 of the solid state storage device 50 can efficiently manage the contents of a read table 505 in order to improve the read speed of the solid state storage device 50. In the following examples, 11 read voltage sets RS0~RS10 are recorded in the read table 505. It is noted that the number of the read voltage sets in the read table 505 is not restricted.

FIG. 6A schematically illustrates a read table of the solid state storage device according to the embodiment of the present invention. In the read table 505, the plural read voltage sets RS0~RS10 with their corresponding accumulative counts are stored with an order, and the plural read voltage sets RS0~RS10 are divided into a hot group and a cold group. The order of the hot group is prior to the order of the cold group. As shown in FIG. 6A, the hot group contains 4 read voltage sets RS0~RS3, and the cold group contains 7 read voltage sets RS4~RS10. The four read voltage sets corresponding to the first four orders (i.e., the order "0" to the order "3") are included in the hot group, and the seven read voltage sets corresponding to the next seven orders (i.e., the order "4" to the order "10") are included in the cold group. As mentioned above, the control circuit 501 sequentially provides the read voltage sets according to the order in the read table 505. Consequently, the sequence of providing the 4 read voltage sets RS0~RS3 of the hot group is prior to the sequence of providing the 7 read voltage sets RS4~RS10 of the cold group. During the read cycle, the read voltage sets in the hot group have the higher priorities to be provided to the non-volatile memory 107 by the control circuit 501.

In this embodiment, the hot group of the read table 505 contains the 4 read voltage sets RS0~RS3, and the cold group of the read table 505 contains 7 read voltage sets RS4~RS10. It is noted that the numbers of the read voltage sets contained in the hot group and the cold group of the read table 505 are not restricted.

During the read cycle, if the read data is successfully decoded by the control circuit 501 according to a specified read voltage set of the read voltage sets, the accumulative count corresponding to the specified read voltage set is added by 1. For example, if the decoding process A is successfully done by the control circuit 501 and the accurate read data is acquired, the accumulative count corresponding to the default read voltage set RS0 is added by 1. Similarly, if the decoding process B is successfully done by the control circuit 501 according to the read voltage set RS6 and the accurate read data is acquired, the accumulative count corresponding to the read voltage set RS6 is added by 1.

When the number of times the read cycle is performed reaches a specified value (e.g., 1000), the control circuit 501 enables a read table adjusting process.

Figure 6B:
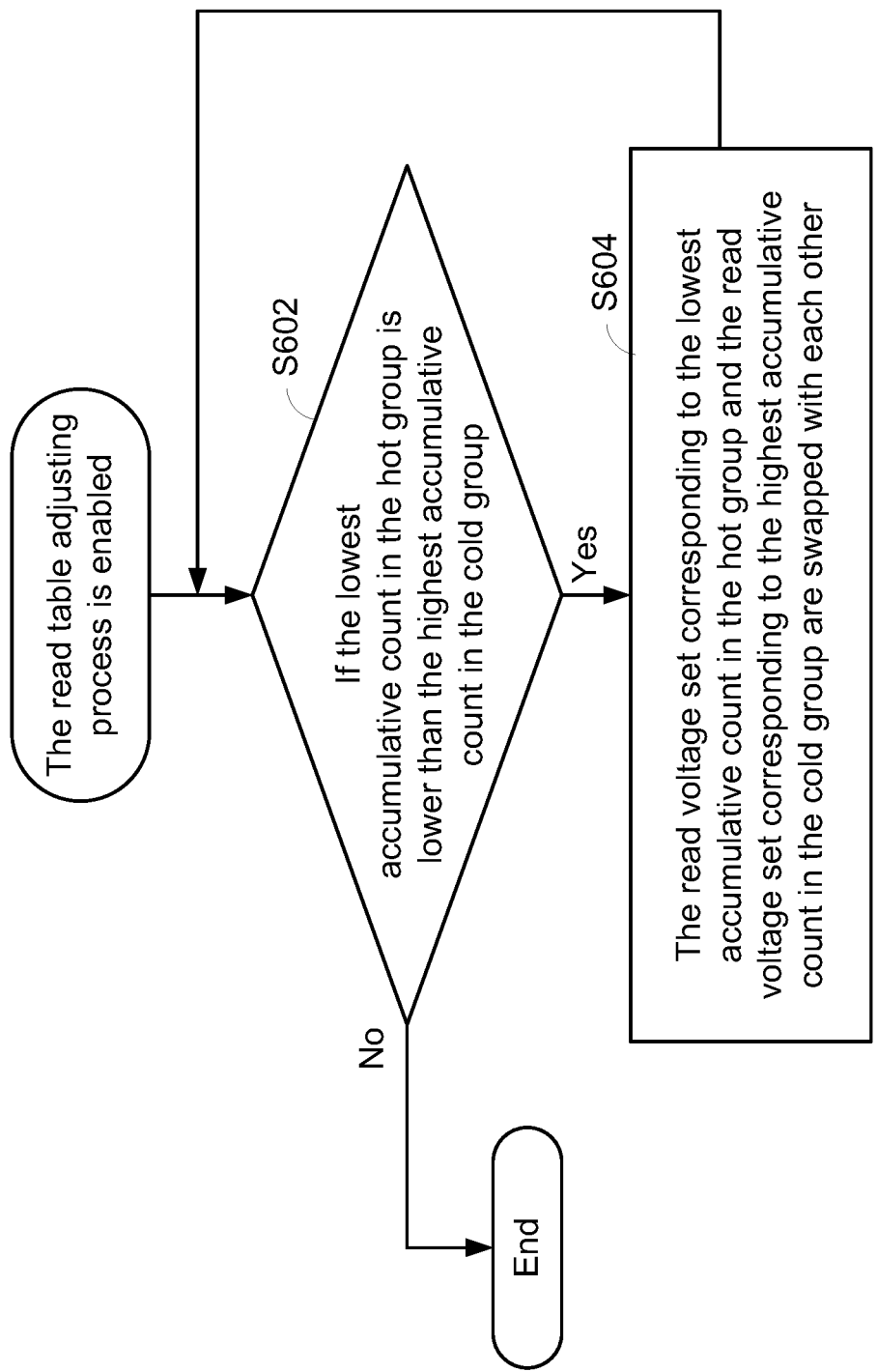
FIG. 6B is a flowchart illustrating a control method of the solid state storage device after the read table adjusting process is enabled.

FIG. 6B is a flowchart illustrating a control method of the solid state storage device after the read table adjusting process is enabled. After the read table adjusting process is enabled, the control circuit 501 judges whether the lowest accumulative count in the hot group is lower than the highest accumulative count in the cold group (Step S602). If the lowest accumulative count in the hot group is lower than the highest accumulative count in the cold group, the read voltage set corresponding to the lowest accumulative count in the hot group and the read voltage set corresponding to the highest accumulative count in the cold group are swapped with each other (Step S604). In other words, the orders of above two read voltage sets are swapped. An implementation example of the read table adjusting process will be described as follows.

FIGS. 7A to 7F schematically illustrate the operations of the read table management method according to the embodiment of the present invention. When the solid state storage device 50 just leaves the factory, the contents of the read table 505 are shown in FIG. 6A. That is, the accumulative counts corresponding to the read voltage sets RS0~RS10 are all 0. When the solid state storage device 50 starts to read the data, the control circuit 501 provides the read voltage sets according to the order sequence in the read table 505 are shown in FIG. 6A. If the read data is successfully decoded by the control circuit 501 according to a specified read voltage set of the read voltage sets, the accumulative count corresponding to the specified read voltage set is updated.

When the number of times the read cycle is performed reaches a specified value (e.g., 1000), the control circuit 501 enables a read table adjusting process. For example, the accumulative counts are listed in the read table 505 as shown in FIG. 7A.

As shown in FIG. 7A, the lowest accumulative count (e.g. 15) in the hot group is lower than the highest accumulative count (e.g., 60) in the cold group. Consequently, the read voltage set RS2 corresponding to the lowest accumulative count in the hot group and the read voltage set RS7 corresponding to the highest accumulative count in the cold group are swapped with each other by the control circuit 501. Meanwhile, the read voltage set RS7 becomes to belong to the hot group, and the read voltage set RS2 becomes to belong to the cold group. Of course, the corresponding accumulative counts are also swapped by the control circuit 501.

Although the read voltage sets are swapped, the order of the hot group and the order of the cold group are not swapped. After the read table adjusting process is completed, the contents of the read table 505 are shown in FIG. 7B. After the read voltage sets are swapped, the four read voltage sets corresponding to the order "0" to the order "3" are also included in the hot group, and the seven read voltage sets corresponding to the order "4" to the order "10" are also included in the cold group. But, the read voltage set corresponding to the order "2" is become to the read voltage set RS7, and the read voltage set corresponding to the order "7" is become to the read voltage set RS2. During the next read cycle, the control circuit 501 provides the read voltage sets according to the order sequence in the read table 505 as shown in FIG. 7B.

Take the error correction method of FIG. 3 for example. While the decoding process A is performed, the read voltage set RS0 corresponding to the order "0" is firstly provided to the non-volatile memory 107 according to the order sequence in the read table 505 as shown in FIG. 7B. In other words, the read voltage set of the hot group having the highest priority is set as a default read voltage set.

If the decoding process A fails, the decoding process B of FIG. 3 is performed. According to the order sequence in the read table 505 as shown in FIG. 7B, the read voltage set RS1 corresponding to the order "1", the read voltage set RS7 corresponding to the order "2", the read voltage set RS3 corresponding to the order "3", the read voltage set RS4 corresponding to the order "4", . . . , the read voltage set RS10 corresponding to the order "10" are sequentially provided to the non-volatile memory 107. If the decoding process B passes according to one of the read voltage sets, it is not necessary to provide the next read voltage set to the non-volatile memory 107.

When the number of times the read cycle is performed reaches the specified value (e.g., 1000), the control circuit 501 enables the read table adjusting process again. For example, the accumulative counts are listed in the read table 505 as shown in FIG. 7C.

As shown in FIG. 7C, the lowest accumulative count (e.g. 51) in the hot group is lower than the highest accumulative count (e.g., 85) in the cold group. Consequently, the read voltage set RS1 corresponding to the lowest accumulative count in the hot group and the read voltage set RS9 corresponding to the highest accumulative count in the cold group are swapped with each other by the control circuit 501. Meanwhile, the read voltage set RS9 becomes to belong to the hot group, and the read voltage set RS1 becomes to belong to the cold group. Of course, the corresponding accumulative counts are also swapped by the control circuit 501.

After the read table adjusting process is completed, the contents of the read table 505 are shown in FIG. 7D. The read voltage set RS9 corresponds to the order "1" and belongs to the hot group, and the read voltage set RS1 corresponds to the order "9" and belongs to the cold group. During the next read cycle, the control circuit 501 provides the read voltage sets according to the order sequence in the read table 505 as shown in FIG. 7D.

When the number of times the read cycle is performed reaches the specified value (e.g., 1000), the control circuit 501 enables the read table adjusting process again. For example, the accumulative counts are listed in the read table 505 as shown in FIG. 7E.

As shown in FIG. 7E, the lowest accumulative count (e.g. 107) in the hot group is lower than the highest accumulative count (e.g., 134) in the cold group. Consequently, the read voltage set RS3 corresponding to the lowest accumulative count in the hot group and the read voltage set RS10 corresponding to the highest accumulative count in the cold group are swapped with each other by the control circuit 501. Meanwhile, the read voltage set RS10 becomes to belong to the hot group, and the read voltage set RS3 becomes to belong to the cold group. Of course, the corresponding accumulative counts are also swapped by the control circuit 501.

After the read table adjusting process is completed, the contents of the read table 505 are shown in FIG. 7F. The read voltage set RS10 corresponds to the order "3" and belongs to the hot group, and the read voltage set RS10 corresponds to the order "3" and belongs to the cold group. During the next read cycle, the control circuit 501 provides the read voltage sets according to the order sequence in the read table 505 as shown in FIG. 7F.

As the read cycle gradually increases, the accumulative counts in the read table 505 are changed. The control circuit 501 adjusts the contents of the read table 505 at the appropriate time. Consequently, in most situations, the control circuit 501 can successfully decode the data according to the read voltage sets in the hot group during the read cycle. That is, in few situations, the data is successfully decoded according to the read voltage sets in the cold group. Consequently, the read speed of the solid state storage device 50 can be effectively enhanced.

From the above descriptions, the present invention provides a solid state storage device and a read table management method. When the number of times the read cycle is performed reaches the specified value, the control circuit 501 enables a read table adjusting process to change the orders of the corresponding read voltage sets. Consequently, the read speed of the solid state storage device 50 can be effectively enhanced.

In addition, the control circuit 501 calculates the number of the read cycles. When the number of times the read cycle is performed reaches the specified value, the control circuit 501 enables the read table adjusting process. It is noted that numerous modifications and alterations may be made while retaining the teachings of the invention. In another embodiment, the read table adjusting process is enabled according to the operation time of the solid state storage device 50. For example, whenever the solid state storage device 50 has been operated for a specified time period (e.g., 100 hours), the control circuit 501 enables the read table adjusting process.

In the above embodiment of the read table adjusting process, the control circuit 501 adjusts the read voltage sets according to the accumulative counts. It is noted that numerous modifications and alterations may be made while retaining the teachings of the invention. In another embodiment, the read voltage sets are adjusted according to another computation value. For example, the computation value is a probability value corresponding to the successful decoding probability of the corresponding read voltage set.

In other words, while the read table adjusting process is performed, the read voltage sets are swapped by the control circuit 501 according to the corresponding computation values. The computation value is the probability value or the accumulative count.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A solid state storage device, comprising:
a control circuit comprising a read table, wherein plural read voltage sets and corresponding computation values are stored in the read table, first portions of the plural read voltage sets belong to a hot group, and second portions of the plural read voltage sets belong to a cold group; and
a non-volatile memory,
wherein during a read cycle, the control circuit determines a selected read voltage set from the plural read voltage sets according to a specified sequence in the read table, and provides the selected read voltage set to the non-volatile memory,
wherein if a decoding operation is successful, the computation value corresponding to the selected read voltage set is modified, wherein if the decoding operation is not successful, the control circuit determines a next selected read voltage set from the plural read voltage sets according to the specified sequence, and provides the next selected read voltage set to the non-volatile memory,
wherein the control circuit enables a read table adjusting process when the number of times the read cycle is performed reaches a specified value or after the solid state storage device has been operated for a specified time period;
wherein if the lowest computation value in the hot group is lower than the highest computation value in the cold group when the read table adjusting process is enabled, a first read voltage set corresponding to the lowest computation value in the hot group and a second read voltage set corresponding to the highest computation value in the cold group are swapped with each other by the control circuit, and the second read voltage set becomes to belong to the hot group, and the first read voltage set becomes to belong to the cold group.

2. The solid state storage device as claimed in claim 1, wherein according to the specified sequence, the read voltage sets belonging to the hot group have a higher priority to be provided to the non-volatile memory than the read voltage sets belonging to the cold group.

3. The solid state storage device as claimed in claim 1, wherein, in the hot group, the read voltage set having the highest priority to be provided to the non-volatile memory is set as a default read voltage set, wherein the default read voltage set is provided to the non-volatile memory before a read retry operation.

4. The solid state storage device as claimed in claim 1, wherein the computation value is an accumulative count, wherein if the decoding operation is successful, the accumulative count corresponding to the selected read voltage set is added by 1.

5. The solid state storage device as claimed in claim 1, wherein the computation value is a probability value indicating a successful decoding probability of the selected read voltage set.

6. The solid state storage device as claimed in claim 1, wherein before the first read voltage set and the second read voltage set are swapped, the first read voltage set corresponds to an x-th order in the read table, and the second read voltage set corresponds to a y-th order in the read table, wherein after the first read voltage set and the second read voltage set are swapped, the second read voltage set corresponds to the x-th order in the read table, and the first read voltage set corresponds to the y-th order in the read table.

7. A read table management method for a solid state storage device, the solid state storage device comprising a control circuit and a non-volatile memory, the control circuit comprising a read table, plural read voltage sets and corresponding computation values being stored in the read table, first portions of the plural read voltage sets belonging to a hot group, second portions of the plural read voltage sets belonging to a cold group, the read table management method comprising steps of:
during a read cycle, determining a selected read voltage set from the plural read voltage sets according to a specified sequence in the read table, and providing the selected read voltage set to the non-volatile memory;
if a decoding operation is successful, modifying the computation value corresponding to the selected read voltage set;
if the decoding operation is not successful, determining a next selected read voltage set from the plural read voltage sets according to the specified sequence, and providing the next selected read voltage set to the non-volatile memory;
enabling a read table adjusting process when the number of times the read cycle is performed reaches a specified value or after the solid state storage device has been operated for a specified time period; and
if the lowest computation value in the hot group is lower than the highest computation value in the cold group when the read table adjusting process is enabled, allowing a first read voltage set corresponding to the lowest computation value in the hot group and a second read voltage set corresponding to the highest computation value in the cold group to be swapped with each other, and the second read voltage set becomes to belong to the hot group, and the first read voltage set becomes to belong to the cold group.

8. The read table management method as claimed in claim 7, wherein according to the specified sequence, the read voltage sets belonging to the hot group have a higher priority to be provided to the non-volatile memory than the read voltage sets belonging to the cold group.

9. The read table management method as claimed in claim 7, wherein, in the hot group, the read voltage set having the highest priority to be provided to the non-volatile memory is set as a default read voltage set, wherein the default read voltage set is provided to the non-volatile memory before a read retry operation.

10. The read table management method as claimed in claim 7, wherein the computation value is an accumulative count, wherein if the decoding operation is successful, the accumulative count corresponding to the selected read voltage set is added by 1.

11. The read table management method as claimed in claim 7, wherein the computation value is a probability value indicating a successful decoding probability of the selected read voltage set.

12. The read table management method as claimed in claim 7, wherein before the first read voltage set and the second read voltage set are swapped, the first read voltage set corresponds to an x-th order in the read table, and the second read voltage set corresponds to a y-th order in the read table, wherein after the first read voltage set and the second read voltage set are swapped, the second read voltage set corresponds to the x-th order in the read table, and the first read voltage set corresponds to the y-th order in the read table.

\* \* \* \* \*